United States Patent [19]
Dohi et al.

[11] Patent Number: 5,227,887
[45] Date of Patent: Jul. 13, 1993

[54] TWO-DIMENSIONAL IMAGE SENSING DEVICE FOR HAVING A STORAGE GATE FOR PLURAL PHOTO DETECTORS

[75] Inventors: Masaji Dohi; Kenji Awamoto; Kazuya Kubo; Yuichiro Ito, all of Kawasaki, Japan

[73] Assignee: Fujitsu Limited, Kawasaki, Japan

[21] Appl. No.: 811,366

[22] Filed: Dec. 20, 1991

[30] Foreign Application Priority Data

Dec. 27, 1990 [JP] Japan ................. 2-408026

[51] Int. Cl.$^5$ ............... H04N 3/14; H04N 5/335
[52] U.S. Cl. .................. 358/213.27; 358/213.28; 358/213.11; 358/213.26
[58] Field of Search ............. 358/213.26, 213.28, 358/213.11, 213.27, 213.29, 213.31

[56] References Cited

U.S. PATENT DOCUMENTS

| | | | |
|---|---|---|---|
| 4,081,841 | 3/1978 | Ochi et al. | 358/213.26 |
| 4,805,026 | 2/1989 | Oda | 358/213.26 |
| 4,816,916 | 3/1989 | Akiyama | 358/213.26 |
| 4,928,158 | 5/1990 | Kimata | 358/213.26 |

Primary Examiner—Michael T. Razavi
Assistant Examiner—Wendy R. Greening
Attorney, Agent, or Firm—Staas & Halsey

[57] ABSTRACT

An image sensing device uses photodiodes arranged in a matrix. Each photodiode is connected to one of p serially-coupled input gate and transfer gate combinations, were p is an integer greater than or equal to 2. Channel terminals of the p transfer gates are commonly-coupled to a serially-coupled storage gate and output switch combination. The serially-coupled storage gate and output switch combination and its associated p input gate and transfer gate combinations can be repeatedly provided in rows and columns, and addressed so that pixels determined by the photodiodes can be serially output from the image sensing device. Among other advantages, by using serially-coupled input gate and transfer gate combinations, the area provided for a storage gate can be increased so that the sensitivity, dynamic range and/or signal-to-noise ratio is increased relative to conventional devices.

11 Claims, 6 Drawing Sheets

TWO-DIMENSIONAL IMAGE SENSING DEVICE FOR HAVING A STORAGE GATE FOR PLURAL PHOTO DETECTORS

BACKGROUND OF THE INVENTION

1. Field of the Invention

This invention relates to a storage-type two-dimensional image sensing device for plural interlacing, where data of each photo-diode is once stored and then output in parallel. More particularly, this invention relates to an infrared image sensor.

2. Description of the Related Art

Figure 1:
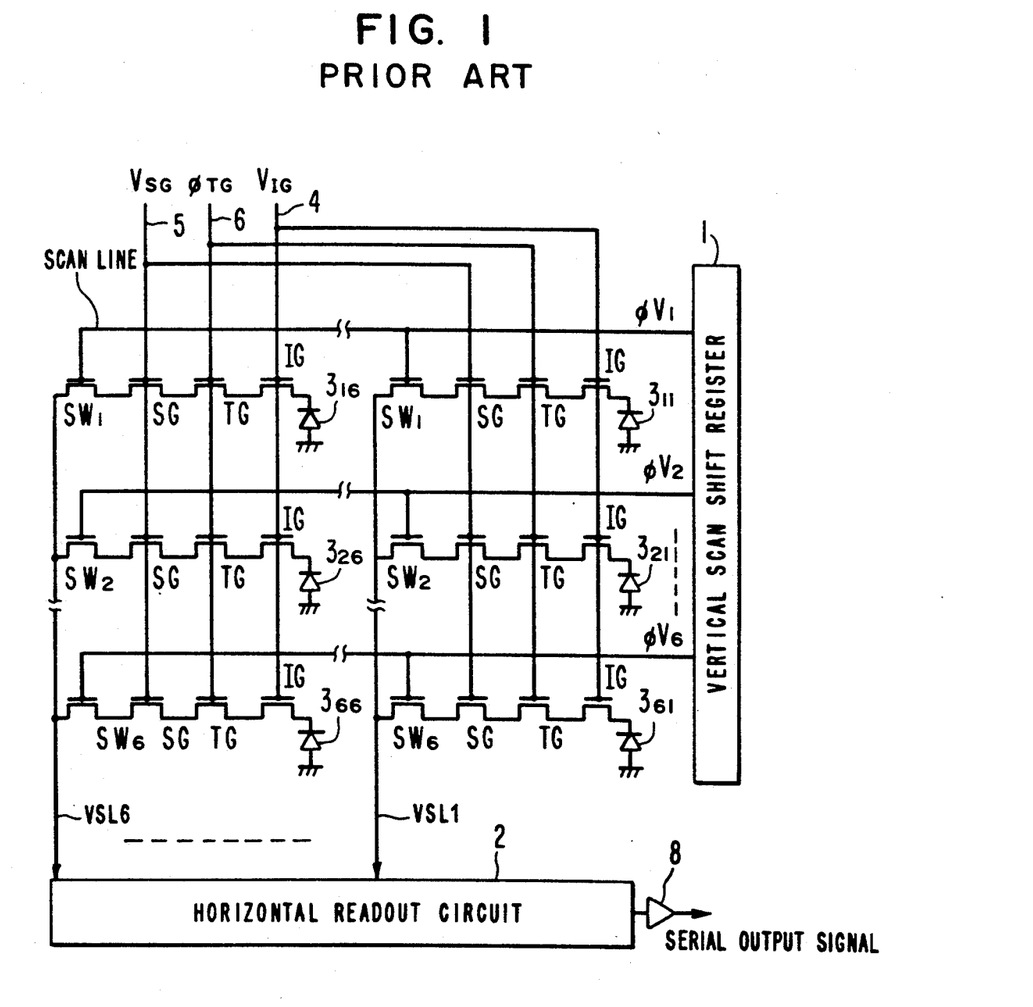
FIG. 1 schematically illustrates a prior art circuit configuration of an image sensing device.
Figure 2:
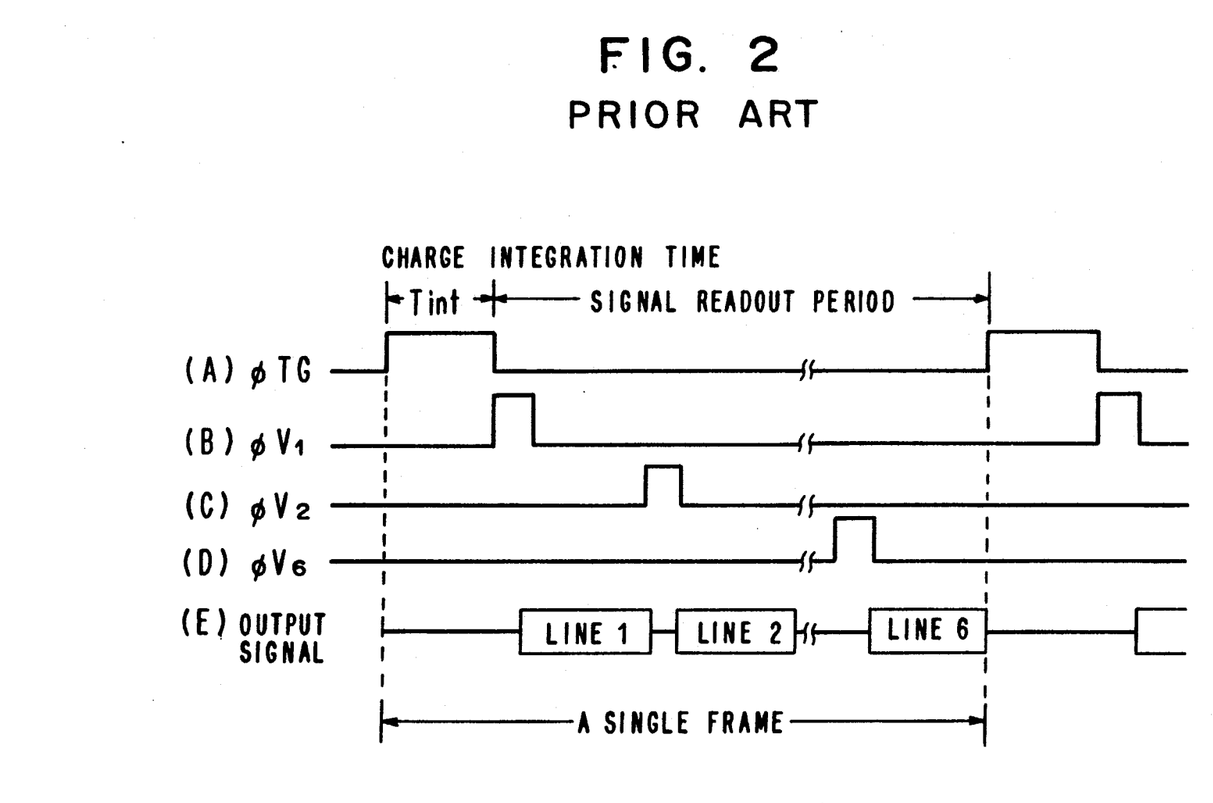
FIG. 2 illustrates a timing chart of the FIG. 1 prior art circuit.

FIG. 1 schematically illustrates a typical prior art circuit configuration of a two-dimensional image sensing device of a storage type, where in order to simplify the drawing there are drawn only 36 (=6×6) photo-diodes $3_{11} \ldots 3_{66}$ arranged in a matrix and their associated CCD (charge-coupled device) circuits for storing the data output from each photo-diode and then outputting in parallel the stored data of photo-diodes on a single horizontal line. FIG. 2 schematically illustrates a timing chart of the FIG. 1 prior art circuit.

Each of input gate line 4 and each of storage gate lines 5 is applied with DC biases $V_{IG}$ and $v_{SG}$, respectively. On an application of a transfer gate signal $\phi TG$ via each transfer gate line 6 to each transfer gate electrode, signal charges generated in each of all the photo-diodes $3_{11} \ldots 3_{66}$ is concurrently transferred to and stored in an associated storage gate SG of each photo-diode. Next, on sequential application of scan signal $\phi V1, \phi V2 \ldots \phi V6$ output from a vertical scan shift register 1, to gate electrodes of output switches SW1 . . . SW6, the electric charges stored in each storage gates SG on a single horizontal line are output via each vertical signal line VSL in parallel to a horizontal read-out circuit 2. Next, thus input data is serially output for each horizontal line to an amplifier 8 as data of each line. The operation is repeated for each frame.

In recent years, it has been seriously required to increase the number of pixels, i.e. number of photo-diodes, of two-dimensionally arranged image sensing device. Then, in order to increase the pixel number without increasing the overall chip size, the element size as well as the element pitch have to be reduced. However, the size reduction of input gate IG, transfer gate TG and output switch SW has already arrived to their minimum limits. Therefore, the storage gate has to suffer the size reduction. According to thus reduced size of the storage type sensor the duration of the charging period, that is, charge integration time Tint, has to be reduced, resulting in reduced electric charge stored in each pixel. This is because the charge integration is approximately proportional to the charging period Tint.

Thus, if the size reduction is really carried out according to the FIG. 1 prior art circuit configuration, the reduced storage gate area worsens the sensitivity, the dynamic range of the detected light, and also the signal-to-noise ratio S/N because the signal-to-noise ratio is determined by the square root of the quantity of the stored charge. If the integration period Tint is not reduced even though the storage gate area is reduced, the electric charge delivered from a photo-diode to which a high temperature IR (infrared) light is injected overflows the storage gate. Consequently, there causes a problem in that the detectable temperature range, i.e. the dynamic range, is limited.

SUMMARY OF THE INVENTION

It is a general object of the invention to provide a two dimensional image sensing device which allows a high sensitivity, an adequate dynamic range and a good signal-to-noise ratio, even when the integration density of the pixel is enhanced.

In an image sensing device having a plurality of photo-diodes $3_{11}, \ldots, 3_{66}$ aligned on a matrix of horizontal lines and on vertical lines, where an electric charge detected by each of photo-diode on one of the horizontal lines is output in parallel via an associated one of a plurality of vertical signal lines VSL1 . . . VSL6, and each of the horizontal lines has a sequential number beginning from 1 to a predetermined even number, two adjacent horizontal lines forms a pair. The pair of the horizontal lines comprises: a storage gate SG commonly provided for a first and a second photo-diode, respectively on horizontal lines of the pair and vertically adjacent with each other; a first transfer gate TG1 for transferring an electric charge output from the first photo-diodes on a horizontal line having an odd number to the storage gate SG, where the first transfer gate TG1 has a first transfer gate electrode TGE1 provided thereon, and the first transfer gate electrode TGE1 is connected to a first transfer gate line TGL1 together with all other first transfer gates in the matrix; a second transfer gate TG2 for transferring an electric charge output from the second photo-diodes on a horizontal line having an even number to the storage gate SG, where the second transfer gate TG2 has a second transfer gate electrode TGE2 provided thereon, and the second transfer gate electrode TGE2 is connected to a second transfer gate line TGL2 together with all other second transfer gates in the matrix; an output switch SW1 . . . SW6 for outputting the electric charge stored in the storage gate SG, where the output switch has a switch gate electrode SWE thereon, and output-terminals of the output switches SW aligned on a same vertical line are commonly connected to one of the vertical signal lines VSL1 or . . . VSL6; and a scan line SCL connected to all of switch gate electrodes SWE1 aligned along the pair of the horizontal lines. On an odd field a first transfer pulse $\phi TG1$ is applied to all the first transfer gate lines TGL1 so as to allow each of the electric charge output from photo-diodes on the odd line to move to an associated one of the storage gates SG, on an even field a second transfer pulse $\phi TG2$ is applied to all the second transfer gate lines TGL2 so as to allow the electric charge output from photo-diodes on the even line to move to associated one of the storage gates SG. The electric charge stored in each storage gate is output to associated vertical signal line VSL1 . . . VSL6 by an application of one of scan voltages $\phi V1 \ldots \phi V3$ to the scan line.

The above-mentioned features and advantages of the present invention, together with other objects and advantages, which will become apparent, will be more fully described hereinafter, with references being made to the accompanying drawings which form a part hereof, wherein like numerals refer to like parts throughout.

DESCRIPTION OF THE PREFERRED EMBODIMENT

Figure 3:
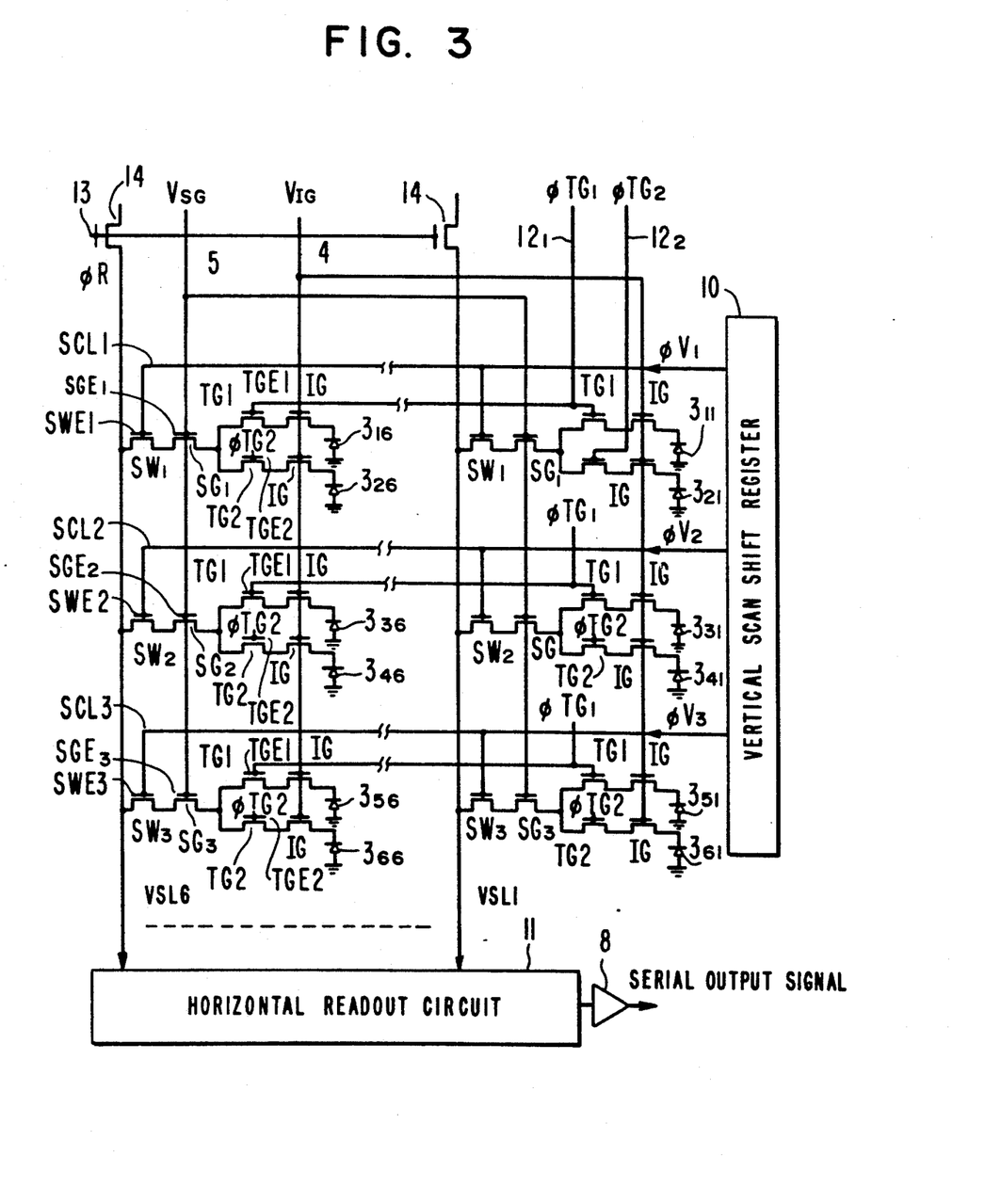
FIG. 3 schematically illustrates a circuit configuration of a first preferred embodiment of the present invention.

FIG. 3 schematically illustrates a circuit configuration of a first preferred embodiment of a two-dimensional image sensing device of the present invention, where in order to simplify the drawing only 36 (6×6) photo-diodes $3_{11} \ldots 3_{66}$ are representatively drawn in a matrix layout, that is, six pixels along a horizontal line, and six pixels along a vertical line, though in a practical device the pixel number is much more, where the number of horizontal lines is an even number n (now n=6). Each horizontal line has m pixels. Each pixel has a photo-diode and related CCD circuit which is described later in detail. Same notations are given to the other same parts as those of the FIG. 1 prior art. The numeral 10 denotes a shift register for vertical scan, for sequentially outputting scan pulses $\phi V1, \ldots \phi V3$, where the number of the output pulses is a half, i.e. n/2, of the horizontal lines, that is, in this case three which is a half of six of the FIG. 1 prior art configuration having the same number n of horizontal lines and pixels number. Accordingly, the numbers of the storage gates SG and the output switches SW are also a half, of the prior art configuration, respectively, i.e. n/2=3 for each.

A first input gate IG, a first transfer gate TG1, a storage gate SG and a switch SW are associated to form a first CCD; and, a second input gate IG2, a second transfer gate TG2, the storage gate SG and the output switch SW are associated to form a second CCD. The CCD itself is of well-known structure, which will be explained later in detail, referring to FIGS. 5 and 6. Input gates IG and storage gate SG are commonly connected to voltage sources of predetermined DC voltages VIG, typically of +0.7 V, and VSG, typically of +10 V, respectively. Each of first and second transfer gates has a first and a second transfer gate electrode TGE1 or TGE2 thereon, respectively. All of first transfer gate electrodes TGE1 and all of second transfer gate electrodes TGE2 are connected to a first transfer gate line 12-1 and a second transfer gate line 12-2, respectively, so that transfer pulses $\phi TG1$ and $\phi TG2$ to respectively enable transfer gates TG1 and TG2 are alternatively applied to first transfer gate line 12-1 and second transfer gate line 12-2.

Switches SW1 ... SW6 are typically formed of MOS transistors. Output terminals, i.e. drains of the MOS transistors, aligned on a vertical line are connected to respective one of vertical signal lines VSL1, ... VSL6. A horizontal read-out circuit 11, which is typically formed of a well-known analog CCD circuit, is input with the vertical signal lines VSL1, ... VSL6 in parallel. Each of vertical signal lines is also connected via a reset transistor 14 to a positive voltage source (not shown in the figure), typically of +15 V. Gate electrodes SWE1 ... or SWE3 of switches SW aligned along the associated horizontal lines are commonly connected to a scan line SCL1 ... or SCL3. Gate electrodes of all the reset transistors 14 are commonly connected to a reset pulse line 13.

Figure 4:
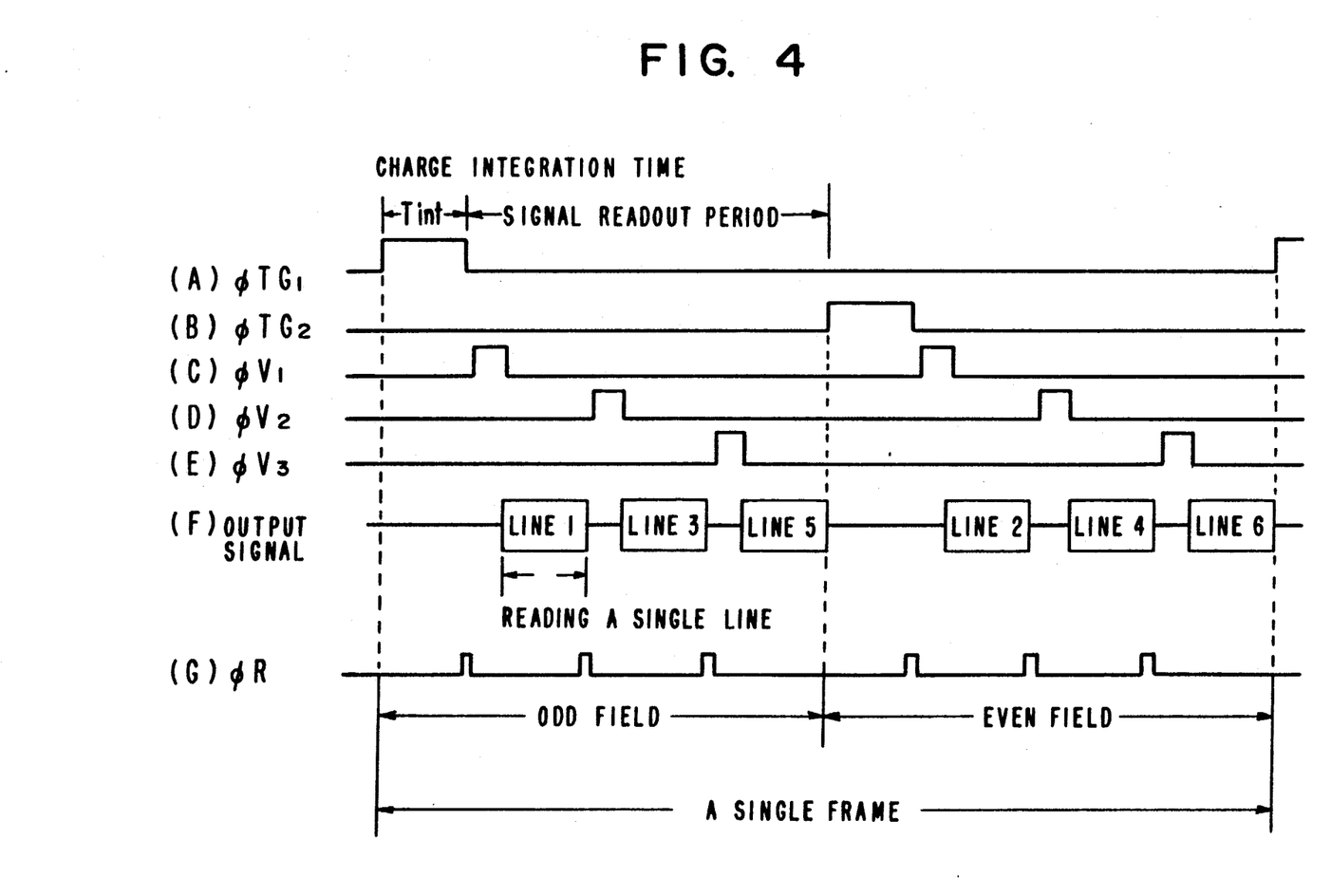
FIG. 4 illustrates a timing chart of the FIG. 3 circuit of the first preferred embodiment.

Referring to timing chart shown in FIG. 4, function of the FIG. 3 circuit is hereinafter described in detail. By an application of first transfer pulse $\phi TG1$ having a pulse duration period Tint to transfer gate line 12-1, the electric charge generated in each of photo-diodes $3_{11} \ldots 3_{16}, 3_{31} \ldots 3_{36}, 3_{51} \ldots 3_{56}$ on horizontal lines of odd number is allowed to move respectively to their associated storage gates SG1. Then, the electric charge can be fully integrated in storage gate SG within the transfer pulse period Tint of, for example 1 ms. The 1 ms is long enough compared with approximately 0.4 ms which is allowed for the case of the same pixel density having the FIG. 1 prior art circuit configuration.

Next, scan signal $\phi V1$ is output from vertical scan shift register 10 via first scan line SCL1 to each of output switch electrodes SWE1 belonging to the first horizontal line so that the charges stored in each of storage gate SG, i.e. an analog IR intensity signal detected by each photo-diode on the first horizontal line, are output in parallel via respective vertical signal line VSL to horizontal read-out circuit 11. The analog signal thus input in parallel to horizontal read-out circuit 11 is serially output as an analog output data of the first horizontal line via an output amplifier 8, by a transfer operation of the analog CCD of the horizontal read-out circuit 11. The serial output signal begins from the data of the most right cell $3_{11}$ to the most left cell $3_{16}$. Then, prior to the next scan signal application a reset pulse $\phi R$ is applied to reset pulse line 13 so that reset transistors 14 become conductive to discharge electric charge undesirably remaining in output switches SW1 ... SW6 to a positive voltage source. This discharge operation reduces a cross talk between the horizontal lines.

Next, the second scan signal $\phi V2$ is applied via second scan line SCL2 to each of output switch electrodes SWE2 associating with the third horizontal line so that the IR intensity data detected by each photo-diode on the third horizontal line are output to horizontal read-out circuit 11, in the same way as the first horizontal line.

The same operations are repeated for the rest of the odd number horizontal lines till the last (n−1) line, i.e. the fifth line in this case. The scanning of the odd field is then completed.

Next, quite a similar operation is carried out on the even number horizontal lines having photo-diodes $3_{21} \ldots 3_{26}, 3_{41} \ldots 3_{46}, 3_{61} \ldots 3_{66}$ each belonging to the even field, except that the second transfer gates TG2 are made conductive instead of the first transfer gates TG1. Storage gates SG and the output switches SW respectively function in the same way as in the odd field. Thus, as seen in FIG. 4, in the even field the data of even number horizontal lines, i.e. of the second, the fourth and the sixth lines, are output. Thus, the even field scanning as well as a single frame of an interlace scanning is then completed. The above-described scanning operation of a single frame is repeated for the subsequent frames.

Figure 5:
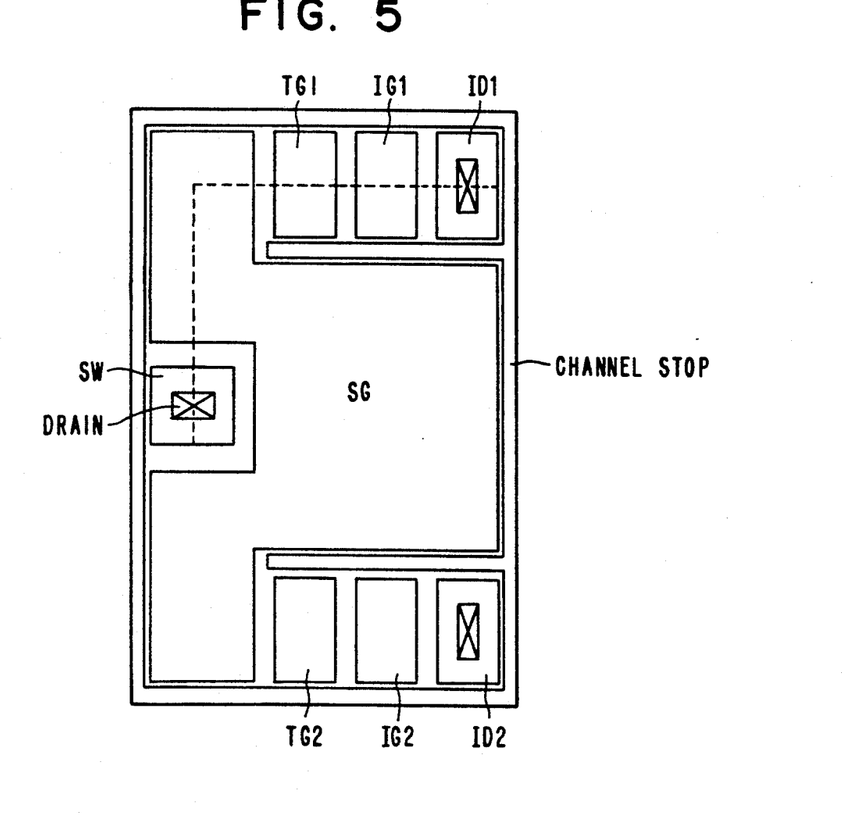
FIG. 5 schematically illustrates a horizontal layout of paired pixels of the present invention.
Figure 6:
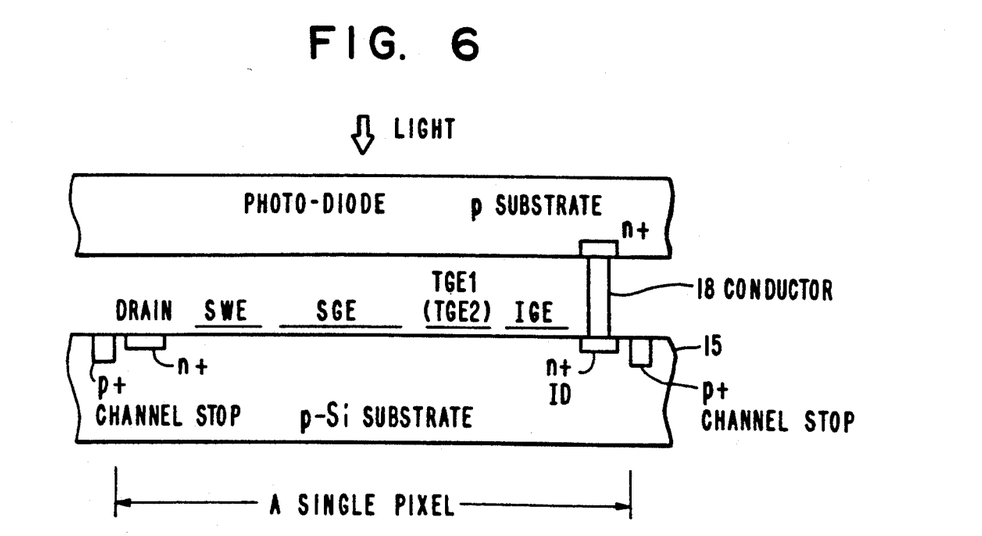
FIG. 6 schematically illustrates a cross-sectional view of the FIG. 5 pixel in principle.

Horizontal layout of paired pixels of the present invention is schematically illustrated in FIG. 5. Crossed-sectional view cut along dotted lines FIG. 5 is schematically illustrates in FIG. 6. Photo-diode pairs, for example $3_{11}$ and $3_{21}$, are provided over an upper half and lower half of the CCD regions ID-IG-TG-(½)SG shown in FIG. 5, respectively, where in order to simplify the drawing the photo-diodes are not illustrated. The CCD regions are formed in a p-silicon substrate 15 according to a widely known technique. The photo-diode is formed of, for example, InSb, or HgCdTe, according to a widely known technique, and is installed over the CCD regions. Each photo-diode is vertically connected by a metal conductor 18 to input diode ID, typically formed of Indium bumps, according to a widely known technique. Channel stops, typically formed of a highly doped +p region, are provided all around the paired CCDs and the associated storage region, and between each ID-IG-TG region and its SG region, as shown in FIG. 5, so that each pixel is isolated from each other.

If the FIG. 1 prior art configuration is to be fabricated on the FIG. 5 layout, the area allowed to storage gate SG must be divided into the upper and lower halves, each of which must also have own output switches SW and channel stop therebetween. Therefore, it is apparent that according to the present invention the area allowed to the storage gate can be almost double of that of the FIG. 1 prior art.

Though in the above preferred embodiment a single storage gate is provided for two photo-diodes, each on two adjacent horizontal lines, it is apparent that the single storage gate may be provided for a plurality p of more than two photo-diodes, where p is such as three or four . . . photo-diodes, each on p adjacent horizontal lines, where accordingly the single frame is composed of p fields, each selected by p transfer pulses $\phi TG1$ to $\phi TGp$, respectively. Accordingly, the total number of the horizontal lines is $p \times q$, where q is a number of groups. In this type of configuration, an area allowed to a single storage gate can be almost p times of the FIG. 1 prior art configuration. Therefore, the capacity of charge integration can be as much as p times of the prior art, resulting in an more improved sensitivity, dynamic range and signal-to-noise ratio than the first preferred embodiment employing a single storage gate for two photo-diodes.

Thus, according to the present invention, the storage gate commonly and alternately serving for a plurality of photo-diodes allows an adequate area for the common storage gate, which accordingly allows an adequate integration time for the storage gate, resulting in accomplishing enhancements of detection sensitivity, enhanced dynamic range and signal-to-noise ratio of each photo-diode.

Figure 7:
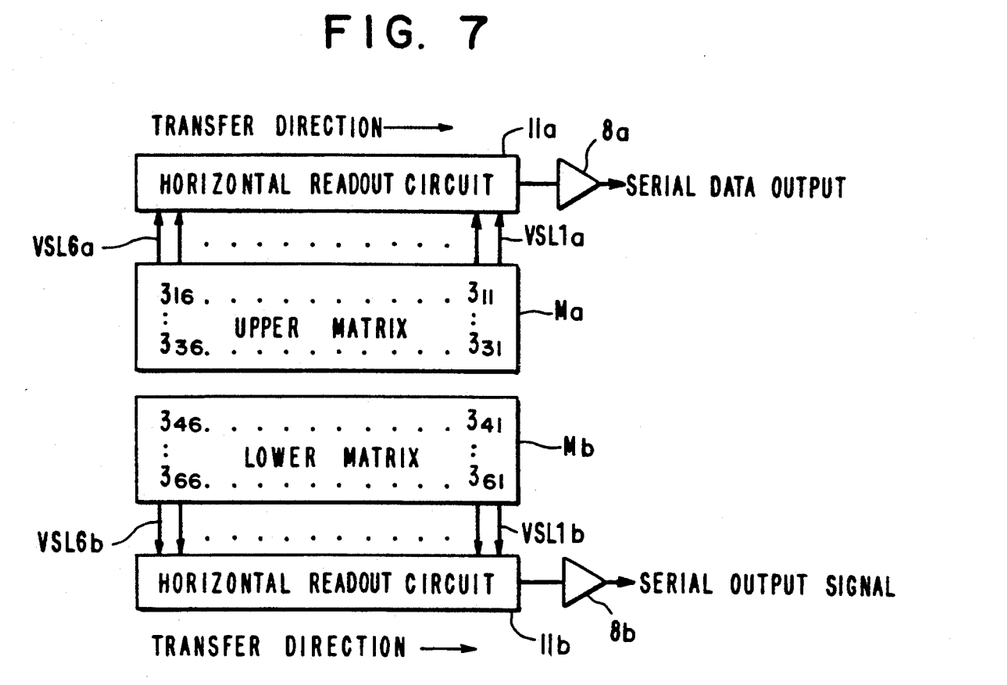
FIG. 7 schematically illustrates a second preferred embodiment of the present invention.

FIG. 7 schematically illustrates a second preferred embodiment of the present invention, where the matrix of the FIG. 3 configuration is divided into an upper matrix Ma and a lower matrix Gm, and two of horizontal read-out circuit 11a and 11b are provided for the respective matrices Ma and Mb. Accordingly, the horizontal lines are divided into tow groups that are an upper half having line numbers 1 to n/2 and a lower half having line numbers (n/2+1) to n, respectively, where n/2 is again an even number. Vertical signal lines VSL1 . . . VSL6 are cut between the two matrices as denoted with VSL1a . . . VSL6a and VSL1b . . . VSL6b; however, the lines of VSG, VIG, $\phi TG1$ and $\phi TG2$ may be continuously common for the two matrices Ma and Mb. A first horizontal read-out circuit 11a having its amplifier 8a is connected to the vertical signal lines of the first group, as well as a second horizontal read-out circuit having its amplifier 8b is connected to the vertical signal lines of the second group.

Figure 8:
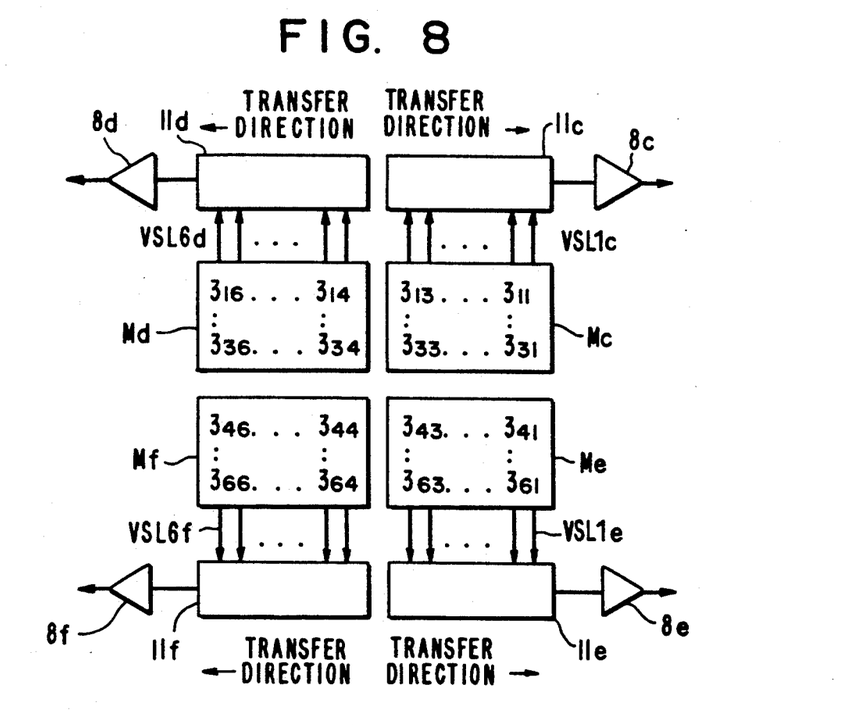
FIG. 8 schematically illustrates a third preferred embodiment of the present invention.

FIG. 8 schematically illustrates a third preferred embodiment of the present invention, where each of the two matrix groups of FIG. 7 are further divided into two, i.e. right and left, matrix groups, and four horizontal read-out circuits 11c . . . 11f are provided for each of thus quaterly divided matrixes. Each of two right horizontal read-out circuits 11c and 11e is input with vertical signal lines of the right half, VSL1 . . . VSL3, of the upper half and lower half matrix Mc and Me, respectively. Each of two left horizontal read-out circuits 11d and 11e are input with vertical signal lines of the left half, VSL4 . . . VSL6, of the upper half and lower half matrix Md and Mf, respectively. The two right horizontal read-out circuits 11c and 11e operate in the similar way of the first and second preferred embodiments. However, the two left horizontal read-out circuits 11d and 11f are such that serially output the data of the last vertical line first, that is, in the order of VSL6 . . . VSL4. Unless this particular configuration is employed, the amplifiers 8d and 8f of the left signal read-out circuits 11d and 11f must be physically located between the two upper horizontal read-out circuits 11c and 11d, as well as between 11e and 11f, on the semiconductor chip. However, due to the highly dense integration of the chip, there is no room to provide the amplifier between the two horizontal read-out circuits. Data output from both the right and left horizontal read-out circuits is respectively converted into a digital data by an A/D (analog-to-digital) converter (not shown in the figure), and next, stored serially in a frame memory formed of a RAM (random access memory) (not shown in the figure). Next, the data stored in the RAM of the left horizontal read-out circuits 11d and 11f are respectively read out in the order opposite to the data series input thereto, that is, from the right end to left end of left signal read-out circuits, i.e. in the order of the data of VSL4 . . . VSL6. Thus, the data on a single horizontal line can be continuously serially read out in the order of VSL1 . . . VSL6 to complete a single horizontal line data.

The second and third preferred embodiments are particularly advantageous in the high density integration where the FIG. 3 preferred embodiment of the present invention is effectively applied to. In the first preferred embodiment and in the above-described multiple-interlace configuration, in order to locate enough time for transfer gate pulses the frequency of the clock pulses for reading out the lines of such a high integration must be increased, for example, several MHzs, which accordingly causes problems in undesirable noise coupling and expensive circuit configuration therefor. The clock frequency for the second and third preferred embodiments can be approximately a half and a quarter of the clock frequency required in the FIG. 3 configuration, respectively.

Though in the above preferred embodiments there are referred to infrared image sensing devices having an infrared photo-diode stacked upon its associated CCD region, it is apparent that the concept of this invention can be embodied in a visible-light image sensing device, where the photo-diode is not necessarily stacked upon its CCD region.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications and equivalents may be resorted to, falling within the scope of the invention.

What we claim is:

1. An image sensing device having a plurality of photo-diodes aligned on a matrix of horizontal lines and vertical lines, each photo-diode capable of generating an electric charge to be output on one of said horizontal lines in parallel via an associated one of a plurality of vertical lines, each of the horizontal lines being assigned a sequential number beginning from 1 to a predetermined even number, said image sensing device comprising:
   a plurality of storage gates, each of which being commonly provided for a first photo-diode and a second photo-diode vertically adjacent with each other and respectively provided on a respective one of said horizontal lines;
   a plurality of first transfer gates, each of which can transfer an electric charge output from said first photo-diodes on a horizontal line having an odd number to said storage gate, said first transfer gate having a first transfer gate electrode provided thereon, all of said first transfer gate electrodes being connected to a first transfer gate line;
   a plurality of second transfer gates, each of which can transfer an electric charge output from said second photo-diode on a horizontal line having an even number to said storage gate, said second transfer gate having a second transfer gate electrode provided thereon, all of said second transfer gate electrodes being connected to a second transfer gate line;
   a plurality of output switches, each of which outputs said electric charge stored in said storage gate, each of said output switches having an output switch electrode thereon, output terminals of said output switches being aligned on a respective vertical line; and
   a scan line connected to all of said output switch electrodes coupled to a respective horizontal line,
   a first transfer pulse applied to said first transfer gate line allowing each of said electric charge output from photo-diodes on said odd horizontal line to be transferred to an associated one of said storage gates, and
   a second transfer pulse applied to said second transfer gate line allowing said electric charge output from photo-diodes on said even horizontal line to be transferred to associated one of said storage gates, and
   said electric charge stored in each storage gate being output to associated vertical signal line by an application of one of scan voltages to said scan line.

2. An image sensing device as recited in claim 1, wherein the photo-diode is for detecting an infrared light intensity.

3. An image sensing device as recited in claim 2, wherein each of the photo-diodes is formed via an insulating layer over a respective storage gate and said first and second transfer gates.

4. An image sensing device as recited in claim 3, wherein a switch is provided between each of the vertical signal line and a power source, for discharging electric charge unnecessarily remaining in said storage gates.

5. An image sensing device as recited in claim 1, wherein the matrix is divided into an upper and lower groups, each of said groups comprises:
   a horizontal readout circuit for receiving data from vertical signal lines of each group in parallel, and serially outputting said received data.

6. An image sensing device as recited in claim 5, wherein each of said divided matrices is further divided into right and left groups, each of said quarterly divided groups comprises:
   a horizontal readout circuit for receiving data from vertical signal lines of each group in parallel, and serially outputting said received data.

7. An image sensing device as recited in claim 6, wherein sequential orders of outputting said received data from said horizontal readout circuits of said right and left groups are in opposite directions with each other.

8. An image sensing device having a plurality of photo-diodes aligned on a matrix of n horizontal lines and on m vertical lines, n and m being positive integers, and an electric charge detected by each of the photo-diodes on one of said horizontal lines being output in parallel via an associated one of m vertical signal lines, the horizontal lines having sequential numbers beginning from 1 to a number n which is p×q, p adjacent photo-diodes forming one of q groups, each of the groups comprising:
   a single storage gate commonly provided for the p photo-diodes of the group;
   p transfer gates, each of which transfers an electric charge output from each of the photo-diodes in the group to said storage gate, said transfer gates having transfer gate electrodes respectively provided thereon, said transfer gate electrodes being respectively connected to a transfer gate line, respectively; and
   an output switch for outputting said electric charge stored in said storage gate, said output switch having an output switch electrode thereon, output switch electrodes in said group being connected to a respective scan line, output terminals of said output switches aligned on a same vertical line being commonly connected to one of the vertical signal lines,
   a transfer pulse respectively applied sequentially to said transfer gate lines of all of said q groups allowing each of said electric charge output from photo-diodes on each of said horizontal lines to move to each storage gate of the group, respectively, and
   said electric charge in each storage gate being output to a respective vertical signal line by an application of one of the scan voltages to said scan line.

9. An image sensor supplied with first and second gate transfer signals and a scan signal, comprising:
   a unit including
      a first photo-diode,
      a first input gate coupled to the first photo-diode,
      a first transfer gate serially coupled to the first input gate,
      a second photo-diode,
      a second input gate coupled to the second photo-diode,
      a second transfer gate serially coupled to the second input gate,
      a storage gate coupled to an output terminal of the first transfer gate and an output terminal of the second transfer gate, and the first transfer gate capable of transferring a signal generated by the first photo-diode to the storage gate based on the first transfer gate signal, the second transfer gate capable of transferring signal generated by the second photo-diode to the storage gate based on the second transfer gate signal, and an output switch serially coupled to the storage gate, for outputting at least one of the signal generated by the first photo-diode and the signal generated by the second photo-diode, based on the scan signal.

10. An image sensor as claimed in claim 9, wherein an input gate bias signal is simultaneously input to the first and second input gates.

11. An image sensor as claimed in claim 9, wherein said image sensor includes a plurality of units arranged in rows and columns, and wherein said scan signal includes a plurality of signals.

* * * * *